United States Patent [19]

Lee et al.

[11] 4,177,087

[45] Dec. 4, 1979

[54] MANUFACTURE OF SUPERCONDUCTING MEMBERS

[75] Inventors: James A. Lee; Peter E. Madsen, both of Harwell; Ronald F. Hills, Newbury, all of England

[73] Assignee: United Kingdom Atomic Energy Authority, London, England

[21] Appl. No.: 931,321

[22] Filed: Aug. 7, 1978

Related U.S. Application Data

[63] Continuation-in-part of Ser. No. 779,507, Mar. 21, 1977, abandoned.

[30] Foreign Application Priority Data

Mar. 23, 1976 [GB] United Kingdom ............... 11708/76

[51] Int. Cl.$^2$ ........................................... H01L 39/24
[52] U.S. Cl. ................................... 148/11.5 R; 29/599
[58] Field of Search ..................... 148/11.5 R, 11.5 F; 29/599

[56] References Cited

U.S. PATENT DOCUMENTS

| 3,465,430 | 9/1969 | Barber et al. ........................ 29/599 |
| 3,570,118 | 3/1971 | Reynolds et al. ..................... 29/599 |
| 3,918,998 | 11/1975 | Marancik et al. ............... 148/11.5 R |
| 3,958,327 | 5/1976 | Marancik et al. ............... 148/11.5 R |

OTHER PUBLICATIONS

Merriman, A. D.; A Dictionary of Metallurgy; Macdonald & Evans, Ltd., London, 1958; p. 225.

Primary Examiner—W. Stallard
Attorney, Agent, or Firm—Larson, Taylor and Hinds

[57] ABSTRACT

In the manufacture of a superconducting member fine filaments of niobium or vanadium in a bronze matrix are formed by mechanical reduction, e.g. by drawing, and by solid state reaction the filaments are converted to superconducting filaments of a compound of niobium or vanadium with, typically, one or more of the elements aluminium, gallium, indium, silicon, germanium and tin included in the bronze. Phosphorus is included in the bronze but care is taken to ensure that the bronze in contact with the filaments is free of unwanted impurities and in particular has a very low concentration of phosphorus, desirably in the range 0.01 to 0.05 percent by weight.

5 Claims, No Drawings

MANUFACTURE OF SUPERCONDUCTING MEMBERS

This application is a continuation-in-part of U.S. patent application Ser. No. 779,507 filed Mar. 21, 1977, now abandoned.

BACKGROUND OF THE INVENTION

The invention relates to the manufacture of superconducting members.

By superconducting member is meant a member which will exhibit superconductivity when its temperature is lowered below its critical temperature. Materials of particular interest in this field are those which have comparatively high critical temperatures and comparatively high critical magnetic fields. Such materials are compounds of the A15 crystal structure having the general formula $A_3B$ where A comprises niobium or vanadium and B typically comprises one or more of the elements aluminium, gallium, indium, silicon, germanium and tin.

The invention is more particularly concerned with the manufacture of a superconducting member comprising a large number of fine superconductive filaments supported in an electrically conductive, non-superconductive matrix, and is an improvement in or development of the inventions described in U.S. Pat. No. 3,728,165 and application Ser. No. 584,905 filed June 9, 1975 as a continuation of application Ser. No. 383,476 filed July 30, 1973.

$A_3B$ compounds with A15 crystal structure are sometimes superconducting with high temperatures of transition from the superconducting to the normal state. These compounds cannot be produced as multifilamentary superconductors by techniques suitable for ductile superconductors because they are very hard and brittle materials. One method suitable for producing $A_3B$ compounds as multifilamentary superconductors is described in U.S. Pat. No. 3,728,165. For example, rods or wires of the element A are embedded in a matrix of a carrier metal containing the element B. Copper is a suitable carrier metal for the production of $Nb_3Sn$ or $V_3Ga$ by this method and the alloy of the carrier metal with the element B is conveniently referred to as "the bronze" or "the Cu—B alloy". The B element is generally in solid solution in the carrier metal since this provides a ductile alloy, but the method can also work when the B element is also present in other phases in the bronze. The element A and the Cu-B alloy may both contain additions of other elements. The composite of rods of element A in a matrix of bronze is fabricated by a simple mechanical deformation process to produce fine filaments of element A in the required configuration in the bronze matrix. The filaments of element A are then converted to compound $A_3B$ by reaction with the B element from the bronze by heating in a temperature range in which the bronze in contact with the element A remains in the solid state.

It is noted in U.S. Pat. No. 3,728,165 that the alloy (Cu-B alloy) may contain other elements in the form of acceptable impurities or additives or diluents which do not unacceptably affect the reaction between the niobium or vanadium with the B element to form the superconducting compound.

SUMMARY OF THE INVENTION

The present invention is based upon the discovery that whilst inclusion of phosphorus in the bronze is necessary or desirable for achieving certain wanted effects, quite small quantities of phosphorus in the bronze can have a deleterious effect upon $A_3B$ superconductor manufactured by the aforedescribed method.

According to the invention there is provided a method of manufacturing a superconductor of A15 crystal structure having the general formula $A_3B$ where A comprises niobium or vanadium and B comprises one or more of the elements of the group consisting of aluminium, gallium, indium, silicon, germanium, gold, platinum, antimony, rhodium, palladium, osmium, ruthenium, cobalt, thallium, lead, arsenic, bismuth, iridium and tin, which method comprises forming an alloy of copper with one or more of the elements B, including phosphorus in the alloy, contacting the alloy with a base material essentially consisting of the metal A, forming the contacted alloy into a unitary structure, the formation of the alloy being carried out such that, at least where it is in contact with the base material, the phosphorus concentration in the alloy is in the range 0.01 to 0.1 percent by weight, preferably 0.01 to 0.05 percent by weight, and heat treating the said unitary structure to cause reaction between the base material and the B element or elements to form superconducting $A_3B$ compound.

Preferably the B element or elements comprises one or more of the elements of the group comprising aluminium, gallium, indium, silicon, germanium and tin.

Preferably the heat treatment is controlled for avoiding melting of the composite material in contact with the base material at any stage during the heat treatment.

DESCRIPTION OF THE PREFERRED EMBODIMENT

Examples of basic methods of manufacture in which the present invention is readily embodied are described in U.S. Pat. No. 3,728,165 and application Ser. No. 584,905 filed June 9, 1975, the disclosures in which specifications are hereby imported by reference.

Phosphorus dissolved in copper-tin bronzes can completely inhibit the formation of $Nb_3Sn$ on niobium embedded in the bronze. This will occur in tin rich solid solution alloys when the phosphorus content is greater than about 0.2 weight percent. Specifically we have observed that $Nb_3Sn$ with good superconducting properties can be made by the "bronze" process referred to above using bronzes containing 4 to 7.2 atomic percent tin which were prepared by vacuum melting high conductivity oxygen free copper with 99.94% pure tin in graphite crucibles and casting under an Argon atmosphere. However, in examples employing 6 atomic percent tin bronze containing 0.5 weight percent phosphorus and a 4 atomic percent tin bronze containing 0.28 weight percent phosphorus, substantially no $Nb_3Sn$ was formed under the reaction conditions. A thin layer of a phase other than $Nb_3Sn$ is formed at the interface between the niobium and the bronze. Microprobe analysis of this layer suggested a composition 45 weight percent phosphorus, 39 weight percent niobium, 12 weight percent copper and 3 weight percent tin. However because of the thinness of this layer the copper and tin values could be due to sampling some bronze in the analysed area, and the niobium could be likewise overestimated. When a commercial 6 atomic percent tin bronze containing 0.2 weight percent phosphorus was used most of the reaction layer on the niobium consisted of the phosphorus rich phase described above, but there were regions of Nb$_3$Sn (not forming a continuous layer) situated between the phosphorus rich phase and the niobium. A multifilamentary composite made from this bronze was found not to be superconducting at 4.2 K when the critical field of the unreacted niobium 'cores' of the filaments was exceeded. At lower phosphorus contents Nb$_3$Sn formation occurs but at a slower rate than in purer bronzes, and the transition of the normal to superconducting state occurs at lower temperatures. Specifically we have found that the formation of Nb$_3$Sn is still retarded when bronze containing 0.14 weight percent phosphorus is used, which leads us to assess about 0.1 weight percent phosphorus as the maximum permissible phosphorus content if reasonable superconducting Nb$_3$Sn is to be formed.

The methods of the examples described in the earlier specifications and imported by reference are therefore modified in accordance with the present invention by the step of ensuring that the phosphorus content of the bronze, at least where it is in contact with filaments of metal A which are to be converted to A$_3$B superconducting filaments, is in the range 0.01 to 0.1 percent by weight and preferably in the range 0.01 to 0.05 percent by weight.

The bronzes used for production of multifilamentary Nb$_3$Sn must be ductile. Consequently the single phase ($\alpha$-Cu) alloys where the tin is present in solid solution in the copper are used. The boundary of this phase is at about 9.1 atomic percent tin at 520° C. to 586° C. and moves to lower tin concentrations at higher and lower temperatures e.g. it is at about 7.7 atomic percent tin at 798° C. A composition close to this phase boundary (e.g. 7.5 atomic percent tin) is employed since the amount of Nb$_3$Sn which can be formed depends on the amount of tin in the bronze. These tin-rich compositions have the added advantages that both the rate of Nb$_3$Sn formation and the superconducting critical current density in the Nb$_3$Sn increase with the initial tin content of the bronze.

Copper tin bronzes with this composition ($\sim$7.5 atomic percent tin) can be made on a laboratory scale by processes such as arc melting, vacuum casting and Zone refining. The phosphorus levels can be kept low, e.g. a 7 atomic percent tin bronze made by vacuum coating contained 0.005 weight percent phosphorus. Porosity was present in this casting. This is due to the shrinkage the metal undergoes on solidification; it cannot be due to dissolved gases since the gases dissolved in the molten bronze are removed during vacuum melting. The limited capacity of this type of equipment (e.g. vacuum casting furnaces) is an impediment to scaling up production of pure bronzes. Commercial bronzes are generally produced on a much larger scale, e.g. by continuous casting. If such bronze could be used in the manufacture of multifilamentary Nb$_3$Sn superconductors the larger scale of production would result in cheaper bronze ingots and the ability to process larger batches of multifilamentary Nb$_3$Sn. Unfortunately the commercially available bronzes containing about 7.5 atomic percent tin also contain 0.2 weight percent, or more, phosphorus so they are useless for Nb$_3$Sn production by the bronze route.

The phosphorus is added to these bronzes to reduce the porosity of the castings. Bronze melted in air will not lose oxygen from the melt and may pick up some more oxygen. On solidifying the solubility of oxygen falls and the oxygen released from solution is trapped as pores in the casting. The oxygen can be removed by adding a deoxidant which reacts with it and produces reaction products which separate from the melt. Phosphorus is the most efficient deoxidant. Phosphorus also increases the fluidity of the bronze by lowering its melting temperatures. This permits more complicated shapes to be cast satisfactorily and produces sounder castings since the still molten liquid can feed into the cavities formed between crystals when they contract on solidification. It also reduces the size of the "pipe" — the long cavity formed at the top of the casting.

We have found that bronzes suitable for manufacturing Nb$_3$Sn by the bronze process and containing less phosphorus than is customarily present in commercial alloys of these compositions can be produced on a commercial scale. Bronzes with compositions near the tin rich end of this solid solution phase have been cast with phosphorus contents of 0.01 to 0.05 weight percent. The 0.01 weight percent phosphorus alloy contained casting defects and sounder castings are obtained with higher phosphorus alloy.

As examples of commercial scale manufacture of multifilamentary Nb$_3$Sn wires, we have used bronzes containing 7.2 atomic percent tin and 0.04 weight percent phosphorus, 7.3 atomic percent tin and 0.04 weight percent phosphorus, and 7.9 atomic percent tin and 0.05 weight percent phosphorus. These were produced on a commercial scale, the first two by downhill casting into vertical moulds and the last by continuous casting. Some slight variations in tin and phosphorus contents may be encountered along these ingots. The superconducting properties of Nb$_3$Sn made from these alloys was found to be satisfactory, that is giving a superconducting critical current density (measured over the whole cross-section of the wire) better than $1 \times 10^5$ amps/cm$^2$ at a magnetic field strength of 5 Tesla. For example one 0.017 inch diameter multifilamentary wire made with the 7.9 atomic percent tin and 0.05 weight percent phosphorus bronze and heat treated at 675° C. had a superconducting critical current density (measured over the whole cross section of the wire) of $2.7 \times 10^5$ amps/cm$^2$ at 5 Tesla.

The invention is not restricted to the details of the foregoing examples. For instance the inventive step may be applied in the methods described in U.S. patent application No. 617,640 filed Sept. 29, 1975 noting that, in some cases, it may be difficult to ensure adequate purity with regard to phosphorus content of the bronze in contact with filaments of A metal to be converted to A$_3$B superconducting filaments, where phosphorus poison is deliberately included in other regions of the bronze, that is bronze adjacent A metal *barriers* present in the matrix for protecting pure copper stabilising metal. On such A metal barriers it is necessary to avoid or reduce formation of A$_3$B superconductor for the reasons explained in U.S. application Ser. No. 617,640 filed Sept. 29, 1975.

We claim:

1. A method of manufacturing a superconducting member embodying a superconductor of A15 crystal structure having the general formula A$_3$B where A comprises niobium or vanadium and B comprises one or more of the elements of the group consisting of aluminium, gallium, indium, silicon, germanium, gold, platinum, antimony, rhodium, palladium, osmium, ruthenium, cobalt, thallium, lead, arsenic, bismuth, iridium and tin, which method comprises forming an alloy of copper with one or more of the elements B, including phosphorus in the alloy, contacting the alloy with a base material essentially consisting of the metal A, forming the contacted alloy into a unitary structure, the formation of the alloy being carried out such that, at least where it is in contact with the base material, the phosphorus concentration in the alloy is in the range 0.01 to 0.1 percent by weight, and heat treating the said unitary structure to cause reaction between the base material and the B element or elements to form superconducting $A_3B$ compound.

2. A method as claimed in claim 1, wherein the formation of the alloy is carried out such that, at least where it is in contact with the base material, the phosphorus concentration in the alloy is in the range 0.01 to 0.05 percent by weight.

3. A method as claimed in claim 1, wherein the B element or elements comprises one or more of the elements of the group comprising aluminium, gallium, indium, silicon, germanium and tin.

4. A method as claimed in claim 1, wherein the heat treatment is controlled for avoiding melting of the alloy in contact with the base material at any stage during the heat treatment.

5. A method of manufacturing a superconducting member embodying $Nb_3Sn$ superconductor, which method comprises forming an alloy of copper with tin, including phosphorus in the alloy, introducing niobium rods into the alloy, working the alloy to form a wire containing a multiplicity of filaments of niobium therein, the formation and working of the alloy being carried out such that, at least where it is in contact with the niobium, the phosphorus concentration in the alloy is in the range 0.01 to 0.05 percent by weight, and heat treating the wire to cause reaction between the niobium and the tin to form $Nb_3Sn$, the heat treatment being controlled for avoiding melting of the alloy in contact with the niobium at any stage during the heat treatment.

* * * * *